United States Patent
de Oliveira et al.

(10) Patent No.: US 10,822,697 B2
(45) Date of Patent: Nov. 3, 2020

(54) METHOD FOR PRODUCING METAL STRUCTURES

(75) Inventors: Peter William de Oliveira, Saarbruecken (DE); Karsten Moh, Saarbruecken (DE); Eduard Arzt, Saarbruecken (DE)

(73) Assignee: Leibniz-Institut Fuer Neue Materialien gemeinnuetzige GmbH, Saarbruecken (DE)

( * ) Notice: Subject to any disclaimer, the term of this patent is extended or adjusted under 35 U.S.C. 154(b) by 0 days.

(21) Appl. No.: 13/988,358

(22) PCT Filed: Nov. 23, 2011

(86) PCT No.: PCT/EP2011/070861
§ 371 (c)(1),
(2), (4) Date: May 20, 2013

(87) PCT Pub. No.: WO2012/069555
PCT Pub. Date: May 31, 2012

(65) Prior Publication Data
US 2013/0236732 A1  Sep. 12, 2013

(30) Foreign Application Priority Data
Nov. 23, 2010   (DE) .................. 10 2010 052 033

(51) Int. Cl.
*C23C 16/48* (2006.01)
*C23C 18/14* (2006.01)

(52) U.S. Cl.
CPC ............ *C23C 16/48* (2013.01); *C23C 18/143* (2019.05); *Y10T 428/31678* (2015.04)

(58) Field of Classification Search
CPC ...... C23C 16/48; C23C 16/482; C23C 16/483
USPC .................................. 427/553, 555
See application file for complete search history.

(56) References Cited

U.S. PATENT DOCUMENTS

| | | | |
|---|---|---|---|
| 5,534,312 A | 7/1996 | Hill et al. | |
| 6,517,995 B1 * | 2/2003 | Jacobson | B01J 19/0046 101/28 |
| 6,911,385 B1 | 6/2005 | Haubrich et al. | |
| 2002/0025425 A1 | 2/2002 | Kawazu | |

(Continued)

FOREIGN PATENT DOCUMENTS

| | | |
|---|---|---|
| JP | 2004344688 A | 12/2004 |
| JP | 2005051222 A | 2/2005 |
| WO | 2010012810 A2 | 2/2010 |

OTHER PUBLICATIONS

Gang Shi et al, Fabrication of TiO2 Arrays using solvnet-assisted soft lithography, Langmuir letter, 2009, 25(17). p. 9639-9643.*

(Continued)

*Primary Examiner* — Dah-Wei D. Yuan
*Assistant Examiner* — Nga Leung V Law
(74) *Attorney, Agent, or Firm* — Cahn & Samuels, LLP

(57) ABSTRACT

A method for producing metal structures includes an initiator composition comprising a photocatalytic substance being applied to a substrate. A precursor composition that can be reduced to a metal by the photocatalytic activity of the nanodusts is applied to the layer. A structure template is then applied, partially displacing the precursor composition, and then the substrate is illuminated. Structured metal structures are thus generated.

14 Claims, 9 Drawing Sheets

(56) References Cited

U.S. PATENT DOCUMENTS

| | | |
|---|---|---|
| 2003/0215723 A1 | 11/2003 | Bearinger et al. |
| 2004/0026258 A1 | 2/2004 | No et al. |
| 2004/0265581 A1 | 12/2004 | Koyanagi et al. |
| 2005/0000880 A1 | 1/2005 | Ackermanns et al. |
| 2005/0023957 A1 | 2/2005 | Kim et al. |
| 2005/0124092 A1* | 6/2005 | Bona .................. B82Y 10/00 438/107 |
| 2006/0144713 A1 | 7/2006 | Song et al. |
| 2007/0202334 A1 | 8/2007 | Xie et al. |
| 2009/0269510 A1* | 10/2009 | Lieberman et al. .......... 427/555 |
| 2009/0295041 A1* | 12/2009 | Petrucci-Samija ....................... B29C 35/0888 264/494 |
| 2011/0143051 A1* | 6/2011 | Ohashi ............... C09D 11/0235 427/553 |
| 2011/0155444 A1 | 6/2011 | Stremsdoerfer |
| 2013/0236708 A1 | 9/2013 | Moh et al. |

OTHER PUBLICATIONS

Jia, Nanoaqueous sol-gel synthesis and growth mechanism of single crystalline TiO2 nanorods with high photocatalytic activity, 2009, Material Research Bulletin, 44, p. 1312-1316.*

Hafez, Synthesis of highly-active single-crystalline TiO2 nanrods and its application in environmental photocatalysis, 2009, Materials letters, vol. 63, pp. 1471-1474 (Year: 2009).*

Castellana, Edward, et al., "Direct Writing of Metal Nanoparticle Films Inside Sealed Microfluidic Channels," Anal Chem., 2006, vol. 78, p. 107-12.

Cozzoli, Davide, et al., "Photocatalytic Synthesis of Silver Nanoparticles Stablized by TiO2 Nanrods: A Semiconductor/Metal Nanocomposite in Homogeneous Nonpolar Solution," Journal of American Chemical Society, 2004, vol. 126, p. 3868-79.

He, Xin, et al., "Studies on a Possible Growth Mechanism of Silver Nanoparticles Loaded on TiO2 Thin Films by Photoinduced Deposition Method," Journal of Non-Crystalline Solids, 2008, vol. 354, p. 1267-71.

Jia, Huimin, et al., "Nonaqueous Sol-Gel Synthesis and Growth Mechanism of Single Crystalline TiO2 Nanorods with High Photocatalytic Activity," Materials Research Bulletin, 2009, vol. 44., p. 1312-16.

Li, Dan, et al., "Photocatalytic Deposition of Gold Nanoparticles on Electrospun Nanofibers of Titania," Chemical Physics Letters, 2004, vol. 394, p. 387-91.

Noh, Chang-Ho, et al., "A Novel Patterning Method of Low-Resistivity Metals," Chemistry Letters, 2005, vol. 34, No. 1, p. 82-83.

Noh, Chang-Ho, et al., "A Novel Patterning Method of Low-Resistivity Metals," Proceedings of SPIE, 2005, vol. 5753, p. 879-86.

Shi, Gang, et al., "Fabrication of TiO2 Arrays Using Solvent-Assisted Soft Lithography," Langmuir Letter, 2009, vol. 25, No. 17, p. 9639-43.

Wang, Qian, et al, "ZnO/Au Hybrid Nanoarchitectures: Wet-Chemical Synthesis and Structurally Enhanced Photcatalytic Performance," Environ. Sci. & Technol., 2009, vol. 43, No. 23, p. 8968-73.

Zhao, Xinmei, et al., "Monitoring Catalytic Degradation of Dye Molecules on Silver-Coated ZnO Nanowire Arrays by Surface-Enhanced Raman Spectroscopy," Journal of Materials Chemistry, 2009, vol. 19, p. 5547-53.

PCT International Application PCT/EP2011/070857, Notification of Transmittal of Translation of International Preliminary Report on Patentability and Written Opinion dated Jun. 6, 2013.

PCT International Application PCT/EP2011/070861, Notification of Transmittal of Translation of International Preliminary Report on Patentability and Written Opinion dated Jun. 6, 2013.

English Abstract of WO 2010012810.

English Abstract of JP 2004344688.

English Abstract of JP 2005051222.

Li et al.: "Fabrication of Titania Nanofibers by Electrospinning," Nano Letters, 2003, vol. 3, No. 4, 555-560.

Teng et al.: "Controllable Synthesis of Different Dimensions Nano-ZnO by Microemulsion and Photocatalytic Activity," Journal of Inorganic Materials, 2010, 25(10), 1034-1040.

Kumar et al., "Silver ion release from antimicrobial polyamide/silver composites", Biomaterials 26 (2005) 2081-2088.

Joo et al., "Large-Scale Synthesis of TIO2 Nanorods via Nonhydrolytic Sol-Gel Ester Elimination Reaction and Their Application to Photocatalytic Inactivation of E. coli", J. Phys. Chem. B 2005, 109, 15297-15302.

Suresh, S., "Semiconductor Nanomaterials, Methods and Applications: A Review", Nanoscience and Nanotechnology 2013, 3(3): 62-74.

Yu et al., "Single-crystalline TiO2 nanorods: Highly active and easily recycled photocatalysts", Applied Catalysis B: Environmental 73 (2007)166-171.

Hafez, "Synthesis of highly-active single-crystalline TiO2 nanorods and its application in environmental photocatalysis", Materials Letters 63 (2009) 1471-1474.

* cited by examiner

METHOD FOR PRODUCING METAL STRUCTURES

This patent application is a U.S. national stage application of PCT international application PCT/EP2011/070861 filed on 23 Nov. 2011 and claims priority of German patent document 10 2010 052 033.0 filed on 23 Nov. 2010, the entirety of which is incorporated herein by reference.

FIELD OF THE INVENTION

The invention relates to a process for producing metallic, especially conductive, structures, and to such substrates and to the use thereof.

Background of the Invention

U.S. Pat. No. 5,534,312 describes a method for producing a metallic structure by applying a light-sensitive metal complex to a substrate and the decomposition thereof by irradiation. This process is complicated, since a light-sensitive complex has to be handled. Moreover, metal oxides are typically formed, and these have to be reduced to the metals in a further step with hydrogen at high temperatures usually exceeding 200° C.

Document US 2004/0026258 A1 describes a process in which a microstructure is first produced on a substrate. These structures serve as nuclei for a further electrolytic deposition operation. In this process too, a reduction step is required as well as the deposition operation.

US 2005/0023957 A1 describes the production of a one-dimensional nanostructure. For this purpose, a coating of a photocatalytic compound is applied on a substrate and exposed through a mask. This forms excited states in the exposed regions. Metals are then deposited electrolytically on this latent image. A disadvantage of this method is the short lifetime of the latent image, which requires immediate further treatment. Moreover, a further deposition step is also required in this method in order to obtain conductive structures.

In document US 2006/0144713 A1, a polymer is applied to the photocatalytic compound in order to extend the lifetime of the excited state. This makes this process even more complicated. In the publications Noh, C.-, et al., *Advances in Resist Technology and Processing XXII, Proceedings of SPIE,* 2005, 5753, 879-886, "A novel patterning method of low-resistivity metals" and Noh, C.-, et al., *Chemistry Letters,* 2005 34(1), 82-83, "A novel patterning method of low-resistivity metals", it is stated that it is also possible to use a layer of amorphous titanium dioxide as the photocatalytic layer. However, in the case of use of crystalline titanium dioxide nanoparticles, it was not possible to achieve sufficient resolution of the structures, probably due to the size of the particles, which leads to a rough surface. Owing to the relatively low photocatalytic activity of amorphous titanium dioxide, it is possible to photocatalytically deposit only a small amount of metal.

Document US 2009/0269510 A1 describes the production of metallic films on a coating of titanium dioxide nanoparticles. For this purpose, spherical particles having a diameter between 3 nm and 20 nm are used. This process can achieve a certain degree of structuring. However, the structures are not transparent and have only low resolution.

The publication Jia, Huimin et al., *Materials Research Bulletin,* 2009, 44, 1312-1316, "Nonaqueous sol-gel synthesis and growth mechanism of single crystalline $TiO_2$ nanorods with high photocatalytic activity" demonstrates the use of nanorods of titanium dioxide for the production of silver coatings by exposure.

All processes require for production of structures masks for the exposure.

It would be advantageous if it were also possible to produce transparent conductive structures by photocatalytic deposition, a problem which has to date usually been solved by means of ITO coatings.

Summary of Invention

The problem addressed by the invention is that of specifying a process which enables the production of metallic structures in a simple manner, especially of conductive structures. The process is also to enable the production of transparent structures.

This problem is solved by the inventions having the features of the independent claims. Advantageous developments of the inventions are characterized in the dependent claims. The wording of all claims is hereby incorporated by reference into the content of this description. The inventions also encompass all viable and especially all mentioned combinations of independent and/or dependent claims.

The problem is solved by a process for producing metallic structures, wherein an initiator composition is applied to a substrate, the composition comprising a photocatalytically active inorganic substance as an initiator, to form an initiator layer. In a further step, a precursor composition comprising a precursor compound for a metal layer is applied to the substrate. To the substrate is a structure template to the initiator layer with partial displacement of the precursor composition applied. The partial displacement results in contact between the structure template and the surface of the initiator layer.

In a further step, the precursor compound is reduced to the metal under the action of electromagnetic radiation on the initiator. As a result of the partial displacement, this only occurs where the structure template has not displaced the precursor composition and hence the precursor compound.

This typically forms a metal layer. A metallic layer is understood here in the context of the invention to mean a layer of a metal. Such layers, given sufficient thickness, may also be conductive. Such conductive layers are particularly preferred. "Conductive" is not necessarily understood to mean the production of structures which intrinsically constitute a conductor track. The production of dots of conductive material also constitutes a structure which is conductive in principle.

Individual process steps are described in detail hereinafter. The steps need not necessarily be conducted in the sequence specified, and the process to be outlined may also have further unspecified steps.

The process described has the advantage that the controlled displacement of the precursor composition can achieve structuring in a simple manner. Such structure templates can be produced in a simple manner.

The substrate which is to be coated with the photocatalytic initiator may be any material suitable for this purpose. The examples of suitable materials are metals or metal alloys, glass, ceramic, including oxide ceramic, glass ceramic or polymers, and also paper and other cellulosic materials. It is of course also possible to use substrates having a surface layer of the aforementioned materials. The surface layer may, for example, arise from a metallization or enameling operation, be a glass or ceramic layer, or arise from a painting operation.

Examples of metals or metal alloys are steel, including stainless steel, chromium, copper, titanium, tin, zinc, brass and aluminum. Examples of glass are soda-lime glass, borosilicate glass, lead crystal and silica glass. The glass may, for example, be panel glass, hollow glass such as vessel glass, or laboratory equipment glass. The ceramic may, for example, be a ceramic based on the oxides $SiO_2$, $Al_2O_3$, $ZrO_2$ or MgO, or the corresponding mixed oxides. Examples of the polymer which, like the metal too, may be present in the form of a film, are polyethylene (PET), e.g. HDPE or LDPE, polypropylene, polyisobutylene, polystyrene (PS), polyvinyl chloride (PVC), polyvinylidene chloride, polyvinyl butyral, polytetrafluoroethylene, polychlorotrifluoroethylene, polyacrylates, polymethacrylates such as polymethylmethacrylate (PMMA), polyamide, polyethylene terephthalate, polycarbonate, regenerated cellulose, cellulose nitrate, cellulose acetate, cellulose triacetate (TAC), cellulose acetate butyrate or rubber hydrochloride. A painted surface may be formed from standard basecoats or paints. In a preferred embodiment, the substrates are films, especially polyethylene terephthalate films or polyimide films.

The initiator composition includes a photocatalytically active inorganic substance as an initiator. A photocatalytic active substance is understood to mean a compound which brings about the reduction of a metal ion in a metal complex to the metal directly and/or indirectly through oxidative activation of the metal complex or of a further substance, without itself being decomposed in the process. The products which form in the course of oxidation result in decomposition of the metal complex and reduction of the metal ion in the complex. The photocatalytic material may be ZnO or $TiO_2$, preference being given to $TiO_2$. More preferably, the $TiO_2$ is in anatase form.

The $TiO_2$ may also be in the form of amorphous $TiO_2$. Preference is given to nanoscale particles or rods of $TiO_2$. For example, nanoscale nanoparticles of $TiO_2$ may be involved, these having an average diameter of less than 200 nm, preferably an average diameter of less than 50 nm, more preferably of less than 10 nm (determined by means of TEM).

Particular preference is given to particles which are obtained with a substoichiometric amount of water under lyothermal conditions, as described, for example, in US 2009/0269510 A1. Such particles may also be produced in doped form.

In a preferred embodiment, the initiator composition comprises nanorods. In the context of the invention, these are generally understood to mean elongated bodies, as opposed to spherical nanoparticles. Such a rod-shaped body can be described, for example, on the basis of two parameters: firstly the diameter of the rod and secondly the length of the rod. Nanorods are notable particularly in that they have a diameter of less than 100 nm, preferably less than 50 nm, preferably less than 40 nm, more preferably less than 30 nm. The length thereof is less than 500 nm, preferably less than 400 nm, more preferably less than 200 nm. The dimensions can be determined by means of TEM. The nanorods usually lie on the longer side in TEM. The diameters determined therefore constitute an average of the diameters of nanorods in different orientation. In the composition, agglomerates of nanorods may also occur. The figures are always based on one nanorod.

In a preferred embodiment, the nanorods have a ratio of length to diameter between 1000:1 and 1.5:1, preferably between 500:1 and 2:1, more preferably between 100:1 and 5:1.

In a preferred embodiment, the nanorods have a length between 30 and 100 nm, with a ratio of length to diameter between 10:1 and 3:1.

By virtue of their elongation, the nanorods have particularly high photocatalytic activity.

For production of the nanorods, all processes known to those skilled in the art are useful. These are, for example, hydrolytic or nonhydrolytic sol-gel processes. For such processes, there are known conditions under which nanorods are obtained.

The nanorods are preferably produced by a nonhydrolytic sol-gel process. For this purpose, a hydrolyzable titanium compound and/or zinc compound is reacted with an alcohol or a carboxylic acid, preferably under protective gas atmosphere. The reaction is preferably performed at temperatures between 10° C. and 100° C., preferably between 15° C. and 30° C. In one embodiment, the reaction can be performed at room temperature.

The hydrolyzable titanium compound is especially a compound of the formula $TiX_4$ where the hydrolyzable X groups, which are different from one another or preferably the same, are, for example, hydrogen, halogen (F, Cl, Br or I, especially Cl and Br), alkoxy (preferably $C_{1-6}$-alkoxy, especially $C_{1-4}$-alkoxy, for example methoxy, ethoxy, n-propoxy, i-propoxy, butoxy, i-butoxy, sec-butoxy and tert-butoxy), aryloxy (preferably $C_{6-10}$-aryloxy, for example phenoxy), acyloxy (preferably $C_{1-6}$-acyloxy, for example acetoxy or propionyloxy) or alkylcarbonyl (preferably $C_{2-7}$-alkylcarbonyl, for example acetyl). One example of a halide is $TiCl_4$. Further hydrolyzable X radicals are alkoxy groups, especially $C_{1-4}$-alkoxy. Specific titanates are $Ti(OCH_3)_4$, $Ti(OC_2H_5)_4$ and Ti(n- or i-$OC_3H_7)_4$. Preference is given to $TiCl_4$.

In the case of a zinc compound, carboxylic acid compounds of zinc are an option, for example $Zn(OAc)_2$.

The alcohol and the carboxylic acid are generally lower alcohols and carboxylic acids. Examples of such compounds are alkyl alcohols, such as methanol, ethanol, n-propanol, i-propanol, n-butanol, i-butanol, neopentanol, glycol, 1,3-propanediol or benzyl alcohols such as benzyl alcohol which may also be substituted on the aromatic ring. Examples of carboxylic acids include, for example, formic acid, acetic acid, propionic acid, butyric acid, oxalic acid. It is also possible to use mixtures of the solvents. Preference is given to the use of benzyl alcohol. The compound is preferably also used as a solvent, i.e. in a distinct excess.

In order to obtain crystalline nanorods, it may be necessary also to conduct a heat treatment, preferably a heat treatment under autogenous pressure. For this purpose, the reaction mixture is treated in a closed vessel at a temperature between 50° C. and 300° C., preferably between 50° C. and 100° C., for 2 hours to 48 hours.

The resulting nanorods can be obtained by simple centrifugation and removal of the solvent.

The nanorods or nanoparticles may also be doped, for example in order to shift the absorption thereof into other spectral regions.

For this purpose, in the case of the nanorods or nanoparticles, in the course of production thereof, a suitable metal compound can be used for doping, for example an oxide, a salt or a complex, for example halides, nitrates, sulfates, carboxylates (e.g. acetates) or acetylacetonates. The compound should appropriately be soluble in the solvent used for the production of the nanorods. A suitable metal is any metal, especially a metal selected from groups 5 to 14 of the periodic table of the elements and the lanthanoids and actinides. The groups are mentioned here in accordance with the new IUPAC system, as shown in Römpp Chemie Lexikon, 9th edition. The metal may occur in the compound in any suitable initial oxidation state.

Examples of suitable metals for the metal compound are W, Mo, Zn, Cu, Ag, Au, Sn, In, Fe, Co, Ni, Mn, Ru, V, Nb, Ir, Rh, Os, Pd and Pt. Metal compounds of W(VI), Mo(VI), Zn(II), Cu(II), Au(III), Sn(IV), In(III), Fe(III), Co(II), V(V) and Pt(IV) are used with preference. Very good results are achieved particularly with W(VI), Mo(VI), Zn(II), Cu(II), Sn(IV), In(III) and Fe(III). Specific examples of preferred metal compounds are $WO_3$, $MoO_3$, $FeCl_3$, silver acetate, zinc chloride, copper(II) chloride, indium(III) oxide and tin(IV) acetate.

The ratio between the metal compound and the titanium or zinc compound also depends on the metal used and the oxidation state thereof. In general, for example, the ratios used are such as to result in a molar ratio of metal in the metal compounds to titanium/zinc in the titanium or zinc compound (Me/Ti(Zn)) of 0.0005:1 to 0.2:1, preferably 0.001:1 to 0.1:1 and more preferably 0.005:1 to 0.1:1.

The doping of the nanoparticles is described in US 2009/0269510 A1, the content of which is hereby incorporated into the subject matter of the description. Essentially, an aforementioned metal compound is also added therein during the preparation.

The resulting nanorods or nanoparticles may also be surface modified, for example in order to impart compatibility with the matrix material used. It is also possible, for example through surface modification with fluorinated groups, to achieve a concentration gradient of the nanorods within the initiator layer. The nanorods accumulate at the surface of the initiator layer which is exposed after the application and cannot damage the substrate in the course of irradiation.

The initiator composition generally comprises a dispersion of the nanorods in at least one solvent. The proportion of the nanorods is less than 20% by weight, preferably less than 10% by weight, more preferably less than 5% by weight. A preferred range is between 0.5% by weight and 3% by weight. Examples are 1% by weight, 1.5% by weight, 2% by weight and 2.5% by weight. The proportion here is based on the initiator composition.

Suitable solvents are solvents known to those skilled in the art for nanoparticles. Preference is given to solvents having a boiling point of less than 150° C. Examples thereof are deionized $H_2O$, methanol, ethanol, isopropanol, n-propanol or butanol. It is also possible to use mixtures. Examples of such mixtures are $H_2O$:alcohol between 80:20% by weight and 20:80% by weight, preferably 50:50% by weight to 20:80% by weight, the alcohol used preferably being ethanol.

For application of the initiator composition, it is possible to use standard processes, for example dipping, rolling, knife coating, flow coating, drawing, spraying, spinning or painting. The dispersion applied is optionally dried and heat treated, for instance for curing or consolidation. The heat treatment used for this purpose depends of course on the substrate. In the case of polymer substrates or polymer surfaces, which generally have a barrier layer (see below), it is of course not possible to use very high temperatures. For example, polycarbonate (PC) substrates are heat treated at about 130° C. for 1 h. In general, the heat treatment is effected, for example, at a temperature of 100 to 200° C. and, if no polymer is present, at up to 500° C. or more. The heat treatment is effected, for example, for 2 min to 2 h.

It is possible to obtain layers with different thickness. For instance, it is possible to obtain layers having a thickness between 5 nm and 200 μm. Preferred layer thicknesses are between 10 nm and 1 μm, preferably 50 nm to 700 nm. The layer thickness may also be between 20 μm and 70 μm.

In a next step, a precursor composition comprising at least one precursor compound for a metal layer is applied to the substrate. For application of the precursor composition, it is possible to use customary methods, for example dipping, rolling, knife coating, flow coating, drawing, spraying, spinning or painting. Typically, the precursor composition is a solution or suspension of the at least one precursor compound. This solution may also comprise a mixture of a plurality of precursor compounds. It is also possible for further assistants, such as reducing agents or wetting aids, to be present in the solution.

The precursor compound is preferably a metal complex. This comprises at least one metal ion or a metal atom and at least one kind of ligand. The metal is, for example, copper, silver, gold, nickel, zinc, aluminum, titanium, chromium, manganese, tungsten, platinum or palladium. In a preferred embodiment, the precursor compound is a silver, gold or copper complex, more preferably a silver complex. The precursor compound may also include several types of metal or mixtures of metal complexes.

The ligands used are generally chelate ligands. These are capable of forming particularly stable complexes. These are compounds having a plurality of hydroxyl groups and/or amino groups. Preference is given to compounds having a molecular weight of less than 200 g/mol, particular preference to compounds having at least one hydroxyl group and at least one amino group. Examples of possible compounds are 3-amino-1,2-propanediol, 2-amino-1-butanol, tris(hydroxymethyl)aminomethane (TRIS), $NH_3$, nicotinamide or 6-aminohexanoic acid. It is also possible to use mixtures of these ligands. In the case of the preferred silver complex, TRIS is preferred as a ligand.

The precursor composition is preferably a solution of the precursor compound. Useful solvents include all suitable solvents. These are, for example, water, alcohols such as methanol, ethanol, n-propanol or i-propanol. It is also possible to use mixtures of the solvents, preferably mixtures of water and ethanol. A suitable mixing ratio is a ratio of 50:50% by weight up to 20:80% by weight of $H_2O$:alcohol, preferably ethanol.

The precursor composition may additionally comprise further assistants, such as surfactants or promoting reducing agents.

The precursor composition can be applied to the substrate in any desired manner. The precursor composition is applied in such a way that the photocatalytic activity of the initiator layer can directly or indirectly trigger the reduction of the metal ion to the metal. This is typically done by applying the precursor composition directly to the initiator layer.

For application of the precursor composition, it is possible to use customary methods, for example dipping, spraying, rolling, knife coating, flow coating, drawing, spinning or painting.

For example, can the application of the precursor composition by means of a frame which is placed onto the substrate and the precursor composition is introduced into the space bounded by the frame which is then formed be carried out. The frame may consist of an elastic material. The frame may have any desired shapes. A rectangular frame is customary. The frame encloses, for example, an area on the substrate of between 1 $cm^2$ and 625 $cm^2$ with a side length between 1 cm and 25 cm. The height of the frame on the substrate determines the thickness of the precursor composition applied. The frame may have a height between 25 μm and 5 mm, preferably between 30 μm and 2 mm.

In a further step, a structure template is applied on the initiator layer with partial displacement of the precursor composition. The structure template is a template of any shape, which, by coming into contact with the surface of the initiator layer, displaces the precursor composition at these points. In this case, the viscosity or fluidity of the precursor composition on the surface of the initiator layer must be such that displacement is possible.

The structure template may, for example, be a stamp or a screen. The structure template may be formed from any desired materials. It should be noted that irradiation of the initiator layer and hence also the reduction of the precursor compound must also still be possible after the application of the structure template on the substrate. If the structure template is not transparent to the radiation used, it may be necessary to conduct the irradiation through the substrate. Preferably, the structure template is transparent to the radiation used at least in the depressions into which the precursor composition is forced on application.

Possible materials for the structure template are known to those skilled in the art from the field of microstructuring stamps. They can, for example, also be obtained with lithographic methods. Examples are metals such as nickel, semimetals such as silicon, or photoresists. It is also possible to use silicones such as PDMS (polydimethylsiloxane).

Advantageously, the structure template is composed of a material transparent to the electromagnetic radiation used, preferably PDMS.

It may be necessary to treat the surface of the structure template, for example by treatment with fluorinated silanes.

It may be necessary to match the configuration of the structure template to the thickness of the layer of the precursor composition, for example in order to provide sufficient space for the displaced precursor compound and enclosed air. This can likewise be influenced by the thickness of the structure template, or by the depth of the depressions present on the surface thereof.

The structure template, with respect to the surface that it comes into contact with, constitutes a negative of the desired metallic structure.

It is also possible that the precursor composition is first applied to the structure template and the two are applied together to the initiator layer.

In a next step, the metal ion of the precursor compound is reduced to the metal by the action of electromagnetic radiation on the initiator. This forms a metallic layer. The electromagnetic radiation is radiation of the wavelength for excitation of the initiator. The irradiation can be accomplished by use of a large-area radiation source such as a lamp, or by means of lasers. Preference is given to using a wavelength in the visible or ultraviolet region of the electromagnetic spectrum, preferably radiation having a wavelength of <500 nm, for example between 200 nm and 450 nm or between 210 nm and 410 nm. Preferable is a radiation having a wavelength of <400 nm.

The light source used may be any suitable light source. Examples of a light source are mercury vapor lamps or xenon lamps.

The light source is arranged at a suitable distance from the substrate to be exposed. The distance may, for example, be between 2.5 cm and 50 cm. The intensity of the radiation may be between 30 $mW/cm^2$ and 70 $mW/cm^2$ within a spectral range from 250 nm to 410 nm.

The irradiation should if possible be effected at right angles to the surface to be exposed.

The irradiation is performed in the duration sufficient for formation of the metallic layer. The duration depends on the coating, the type of initiator, the type of lamp, the wavelength range used and the intensity of irradiation. If conductive structures are to be produced, longer irradiation may be required. Preference is given to a duration of the irradiation between 5 seconds and 10 minutes, preferably between 20 seconds and 4 minutes.

If a laser is used for irradiation, it is possible, for example, to use a 10 mW argon ion laser (351 nm), the focused and collimated laser beam of which is conducted over the substrate to be irradiated at a speed of 2 mm/s.

As far as possible, the irradiation can be conducted from the side of the structure template or through the substrate. Preference is given to irradiation through the structure template.

After the irradiation, the structure template is removed.

In a further embodiment of the invention, the substrate is treated further after the treatment and reduction of the precursor compound. For example, the unreduced excess precursor composition can be removed by rinsing the surface, for example with deionized water or another suitable substance. The coated substrate can then be dried, for example by heating in an oven, compressed air and/or by drying at room temperature.

It is also possible to apply further layers, for example for protection of the coated surface from oxidation and water or from UV radiation.

In one embodiment of the invention, structuring is additionally effected in the course of application of the precursor composition and/or in the course of reduction. In the context of the invention, this is understood to mean a preparation of the spatially limited production of the metallic structure. This is possible in different ways. Firstly, the substrate can be coated with the initiator composition only in particular regions. It is also possible to apply the precursor composition only to particular regions. In addition, it is of course also possible to limit the action of electromagnetic radiation to particular regions. These processes can of course also be used in combination. For example, it is possible to apply the precursor composition over a large area and then to expose it through a mask. It is of course likewise possible to apply the precursor composition selectively and then to expose the whole area.

Important factors for the quality of the structures obtained are not only the photocatalytic activity of the initiator but also the quality, for example the wettability or roughness, of the initiator layer in relation to the precursor composition. Specifically the inventive initiator compositions are notable in that controlled application of the precursor composition and/or very controlled reduction of the precursor compound are possible thereon.

In a preferred embodiment of the invention, the structuring comprises structures having a minimum lateral dimension of less than 500 μm. This means that the structures produced on the substrate have a minimum width of 500 μm, preference being given to a dimension of less than 100 μm, 50 μm, 20 μm, more preferably 10 μm. Even structures of less than 5 μm or less than 1 μm are possible.

An important factor for the resolution of the metallic structures achieved, i.e. the formation of the metal layer, is the structure of the photocatalytic layer formed. As well as the use of the nanorods, it is possible to attain the resolution achieved by a pretreatment of the substrate. Such a pretreatment may also mean the application of a further layer.

In a preferred development of the invention, the pretreatment includes a plasma treatment, corona treatment, flame treatment and/or the application and curing of an organic-inorganic coating. A plasma treatment, corona treatment and/or flame treatment is an option particularly in the case of film substrates, especially in the case of polymer films. It has been found that such a treatment improves the quality of the photocatalytic layer obtained.

Possible ways of maintaining plasma under vacuum conditions have been described frequently in the literature. The electrical energy can be bound by inductive or capacitive means. It may be direct current or alternating current; the frequency of the alternating current may range from a few kHz up to the MHz range. Energy supply in the microwave range (GHz) is also possible.

The primary plasma gases used may, for example, be He, argon, xenon, $N_2$, $O_2$, $H_2$, steam or air, and likewise mixtures of these compounds. Preference is given to an oxygen plasma.

Typically, the substrates are cleaned beforehand. This can be accomplished by simple rinsing with a solvent. The substrates are then optionally dried and then treated with plasma for less than 5 minutes. The treatment time may depend on the sensitivity of the substrate. It is typically between 1 and 4 minutes.

A further means of improving the quality of the photocatalytic layer is prior flame treatment of the surface. Such a treatment is known to those skilled in the art. The parameters to be selected are defined by the particular substrate to be treated. For example, the flame temperatures, the flame intensity, the residence times, the distance between substrate and oven, the nature of the combustion gas, air pressure, moisture, are matched to the substrate in question. The flame gases used may, for example, be methane, propane, butane or a mixture of 70% butane and 30% propane. This treatment too preferably finds use in the case of films, more preferably in the case of polymer films.

In a further embodiment of the invention, the initiator composition comprises a compound having at least 2 polar groups. These are preferably organic compounds. Polar groups are understood to mean groups containing O, N or S. They are preferably compounds which contain at least 2 OH, $NH_2$, NH or SH groups. Such compounds may lead to an improvement in the initiator layer obtained. Examples of such compounds are oligomers of compounds such as 1,2-ethanediol, 1,3-propanediol, 1,4-butanediol, 1,2-ethylenediamine, 1,3-propanediamine, 1,4-butanediamine, each of which is joined via an oxygen, nitrogen or sulfur atom. In this case, oligomers consist of 2 to 4 of the aforementioned compounds. Examples are monoethylene glycol (MEG), diethylene glycol (DEG), triethylene glycol.

The compound is preferably used in proportions of less than 10% by weight based on the mass of nanorods in the suspension, preferably less than 5% by weight, more preferably between 1 and 4% by weight.

In a preferred embodiment, the initiator composition comprises an inorganic or organically modified inorganic matrix-forming material. This may especially comprise inorganic sols or organically modified inorganic hybrid materials or nanocomposites. Examples thereof are optionally organically modified oxides, hydrolyzates and (poly)condensates of at least one glass- or ceramic-forming element M, especially an element M from groups 3 to 5 and/or 12 to 15 of the periodic table of the elements, preferably of Si, Al, B, Ge, Pg, Sn, Ti, Zr, V and Zn, especially those of Si and Al, most preferably Si, or mixtures thereof. It is also possible for portions of elements of groups 1 and 2 of the periodic table (e.g. Na, K, Ca and Mg) and of groups 5 to 10 of the periodic table (e.g. Mn, Cr, Fe and Ni) or lanthanoids to be present in the oxide, hydrolyzate or (poly)condensate. Preferred organically modified inorganic hybrid materials are polyorganosiloxanes. For this purpose, particular preference is given to using hydrolyzates of glass- or ceramic-forming elements, especially of silicon.

The inorganic or organically modified inorganic matrix-forming material is preferably added in such an amount that the ratio between the photocatalytically active substance and the matrix-forming material, based on % by weight of the overall composition, is between 300:1 and 1:300, preferably between about 30:1 and 1:30, more preferably between 1:20 and 1:2.

In the case of lyothermally produced titanium nanoparticles, the organically modified inorganic matrix-forming material is preferably added in such an amount that the molar ratio of titanium in the titanium compound to glass- or ceramic-forming element M is 100:0.01 to 0.01:100, preferably 300:1 to 1:300.

Very good results are obtained with a molar Ti/M ratio of about 10:3 to 1:30.

This addition achieves an improvement in adhesion. If an organically modified inorganic matrix-forming material is used, all or only some of the glass- or ceramic-forming elements M present may have one or more organic groups as nonhydrolyzable groups.

The inorganic or organically modified inorganic matrix-forming materials can be produced by known processes, for example by flame pyrolysis, plasma processes, gas phase condensation processes, colloid techniques, precipitation processes, sol-gel processes, controlled nucleation and growth processes, MOCVD processes and (micro)emulsion processes.

The inorganic sols and especially the organically modified hybrid materials are preferably obtained by the sol-gel process. In the sol-gel process, which can also be used for separate production of the particles, usually hydrolyzable compounds are hydrolyzed with water, optionally with acidic or basic catalysis, and optionally at least partly condensed. The hydrolysis and/or condensation reactions lead to formation of compounds or condensates having hydroxyl or oxo groups and/or oxo bridges, which serve as precursors. It is possible to use stoichiometric amounts of water, but also smaller or greater amounts. The sol which forms can be adjusted to the viscosity desired for the coating composition by means of suitable parameters, for example degree of condensation, solvent or pH. Further details of the sol-gel process are described, for example, in C. J. Brinker, G. W. Scherer: "Sol-Gel Science—The Physics and Chemistry of Sol-Gel-Processing", Academic Press, Boston, San Diego, New York, Sydney (1990).

The preferred sol-gel process affords the oxides, hydrolyzates or (poly) condensates by hydrolysis and/or condensation from hydrolyzable compounds of the abovementioned glass- or ceramic-forming elements, which optionally additionally bear nonhydrolyzable organic substituents for production of the organically modified inorganic hybrid material.

Inorganic sols are formed by the sol-gel process particularly from hydrolyzable compounds of the general formulae MX, in which M is the above-defined glass- or ceramic-forming element, X is as defined in formula (I) below, where two X groups may be replaced by an oxo group, and n corresponds to the valency of the element and is usually 3 or 4. Preference is given to hydrolyzable Si compounds, especially of the formula (I) below.

Examples of usable hydrolyzable compounds of elements M other than Si are Al $(OCH_3)_3$, Al$(OC_2H_5)_3$, Al(O-n-$C_3$ $H_7)_3$, $Al(O-i-C_3H_7)_3$, $Al(O-n-C_4H_9)_3$, $Al(O-sec-C_4H_9)_3$, $AlCl_3$, $AlCl(OH)_2$, $Al(OC_2H_4OC_4H_9)_3$, $TiCl_4$, $Ti(OC_2H_5)_4$, $(O-n-C_3H_7)_4$, $Ti(O-i-C_3H_7)_4$, $Ti(OC_4H_9)_4$, Ti(2-ethylhexoxy)$_4$, $ZrCl_4$, $Zr(OC_2H_5)_4$, $Zr(O-n-C_3H_7)_4$, $Ar(O-i-C_3H_7)_4$, $Zr(OC_4H_9)_4$, $ZrOCl_2$, Zr(2-ethylhexoxy)$_4$, and Zr compounds having complexing radicals, for example β-diketone and (meth)acryloyl radicals, sodium methoxide, potassium acetate, boric acid, $BCl_3$, $B(OCH_3)_3$, $B(OC_2H_5)_3$, $SnCl_4$, $Sn(OCH_3)_4$, $Sn(OC_2H_5)_4$, $VOCl_3$ and $VO(OCH_3)_3$.

The remarks which follow regarding the preferred silicon also apply mutatis mutandis to other elements M. More preferably, the sol or the organically modified inorganic hybrid material is obtained from one or more hydrolyzable and condensable silanes, at least one silane optionally having a nonhydrolyzable organic radical. Particular preference is given to using one or more silanes having the following general formulae (I) and/or (II):

$$SiX_4 \qquad (I)$$

in which the X radicals are the same or different and are each hydrolyzable groups or hydroxyl groups, $$R_aSiX_{(4-a)} \qquad (II)$$

in which R is the same or different and is a nonhydrolyzable radical which optionally has a functional group, X is as defined above and a has the value of 1, 2 or 3, preferably 1 or 2.

In the above formulae, the hydrolyzable X groups are, for example, hydrogen or halogen (F, Cl, Br or I), alkoxy (preferably $C_{1-6}$-alkoxy, for example methoxy, ethoxy, n-propoxy, i-propoxy and butoxy), aryloxy (preferably $C_{6-10}$-aryloxy, for example phenoxy), acyloxy (preferably $C_{1-6}$-acyloxy, for example acetoxy or propionyloxy), alkylcarbonyl (preferably $C_{2-7}$-alkylcarbonyl, for example acetyl), amino, monoalkylamino or dialkylamino having preferably 1 to 12 and especially 1 to 6 carbon atoms in the alkyl group(s).

The nonhydrolyzable R radical is, for example, alkyl (preferably $C_{1-6}$-alkyl, for example methyl, ethyl, n-propyl, isopropyl, n-butyl, s-butyl and t-butyl, pentyl, hexyl or cyclohexyl), alkenyl (preferably $C_{2-6}$-alkenyl, for example vinyl, 1-propenyl, 2-propenyl and butenyl), alkynyl (preferably $C_{2-6}$-alkynyl, for example acetylenyl and propargyl) and aryl (preferably $C_{6-10}$-aryl, for example phenyl and naphthyl).

The R and X radicals mentioned may optionally have one or more customary substituents, for example halogen, ether, phosphoric acid, sulfo, cyano, amide-, mercapto, thioether or alkoxy groups, as functional groups.

The R radical may contain a functional group through which crosslinking is possible. Specific examples of the functional groups of the R radical are epoxy, hydroxyl, amino, monoalkylamino, dialkylamino, carboxyl, allyl, vinyl, acryloyl, acryloyloxy, methacryloyl, methacryloyloxy, cyano, aldehyde and alkylcarbonyl groups. These groups are preferably bonded to the silicon atom via alkylene, alkenylene or arylene bridging groups which may be interrupted by oxygen or sulfur atoms or —NH— groups. The bridging groups mentioned derive, for example, from the abovementioned alkyl, alkenyl or aryl radicals. The bridging groups of the R radicals contain preferably 1 to 18 and especially 1 to 8 carbon atoms.

Particularly preferred hydrolyzable silanes of the general formula (I) are tetraalkoxysilanes, such as tetramethoxysilane and especially tetraethoxysilane (TEOS). Inorganic sols obtained by acidic catalysis, for example TEOS hydrolyzates, are particularly preferred. Particularly preferred organosilanes of the general formula (II) are epoxysilanes such as 3-glycidyloxypropyltrimethoxysilane (GPTS), methacryloyloxypropyltrimethoxysilane and acryloyloxypropyltrimethoxysilane, and GPTS hydrolyzates are usable advantageously.

If an organically modified inorganic hybrid material is prepared, it is possible to use exclusively silanes of the formula (II) or a mixture of silanes of the formulae (I) and (II). In the inorganic silicon-based sols, exclusively silanes of the formula (I) are used, optionally with addition of proportions of hydrolyzable compounds of the above formula $MX_n$.

Particular preference is given to organically modified inorganic hybrid materials which are prepared from titanium-based sols. It is also possible to use silanes of the formulae (I) and/or (II).

If the inorganic sol consists of discrete oxide particles dispersed in the solvent, they can improve the hardness of the layer. These particles are especially nanoscale inorganic particles. The particle size (volume average determined by radiography) is, for example, in the range below 200 nm, especially below 100 nm, preferably below 50 nm, for example 1 nm to 20 nm.

According to the invention, it is possible, for example, to use inorganic sols of $SiO_2$, $ZrO_2$, $GeO_2$, $CeO_2$, ZnO, $Ta_2O_5$, $SnO_2$ and $Al_2O_3$ (in all polymorphs, especially in the form of boehmite AlO(OH)), preferably sols of $SiO_2$, $Al_2O_3$, $ZrO_2$, $GeO_2$ and mixtures thereof, as nanoscale particles. Some sols of this kind are also commercially available, for example silica sols, such as the Levasile® from Bayer AG.

The inorganic or organically modified inorganic matrix-forming material used may also be a combination of such nanoscale particles with organically modified hybrid materials or inorganic sols present in the form of hydrolyzates or (poly)condensates, which are referred to here as nanocomposites.

It is optionally also possible for organic monomers, oligomers or polymers of all kinds to be present as organic matrix-forming materials which serve as flexibilizers, and these may be standard organic binders. These can be used to improve coatability. In general, they are degraded photocatalytically on completion of the layer. The oligomers and polymers may have functional groups through which crosslinking is possible. This possibility of crosslinking is also optionally possible in the case of the above-detailed organically modified inorganic matrix-forming materials. Also possible are mixtures of inorganic, organically modified inorganic and/or organic matrix-forming materials.

Examples of usable organic matrix-forming materials are polymers and/or oligomers having polar groups, such as hydroxyl, primary, secondary or tertiary amino, carboxyl or carboxylate groups. Typical examples are polyvinyl alcohol, polyvinylpyrrolidone, polyacrylamide, polyvinylpyridine, polyallylamine, polyacrylic acid, polyvinyl acetate, polymethylmethacrylic acid, starch, gum arabic, other polymeric alcohols, for example polyethylene-polyvinyl alcohol copolymers, polyethylene glycol, polypropylene glycol and poly (4-vinylphenol), or monomers or oligomers derived therefrom.

As already mentioned above, in the case of substrates which consist of a sensitive material or have a surface layer (for example a paint or enamel layer) of such a sensitive material, direct application is possible only with difficulty, if at all. A barrier layer may be arranged between the substrate (optionally with surface coating) and the photocatalytic layer. For this purpose, an inorganic layer of an inorganic matrix-forming material may be used. For this purpose, the above-described inorganic sols may be used.

It is also possible to produce a photocatalytic layer with "incorporated" barrier layer, by forming a concentration gradient of photocatalytically active nanorods or nanoparticles in the photocatalytic layer. This can be accomplished, for example, by a surface modification of the photocatalytically active substance with hydrophobic groups, especially fluorinated organic groups or organic alkyl groups. Processes for surface modification are known to those skilled in the art.

The matrix-forming material may also additionally comprise titanium dioxide, for example as amorphous $TiO_2$, $TiO_2$ nanoparticles or $TiO_2$ nanorods. These constituents may be present in a proportion between 10% by weight and 80% by weight, based on the composition of the matrix-forming material, in the preparation of the initiator composition, preferably between 25% by weight and 65% by weight.

The compounds mentioned above as matrix-forming components can also be used for the pretreatment of the substrate in the application and curing of the organic-inorganic coating. It is possible either to use sols or to apply a solution of a hydrolyzable metal compound.

Preference is given to applying a solution of a silane of the formula II. Particular preference is given to silanes of the formula II in which R contains a functional group through which crosslinking is possible. Specific examples of the functional groups of the R radical are epoxy, hydroxyl, amino, monoalkylamino, dialkylamino, carboxyl, allyl, vinyl, acryloyl, acryloyloxy, methacryloyl, methacryloyloxy, cyano, aldehyde and alkylcarbonyl groups. These groups are preferably bonded to the silicon atom via alkylene, alkenylene or arylene bridging groups which may be interrupted by oxygen or sulfur atoms or —NH— groups. The bridging groups mentioned derive, for example, from the abovementioned alkyl, alkenyl or aryl radicals. The bridging groups of the R radicals contain preferably 1 to 18 and especially 1 to 8 carbon atoms.

Particularly preferred organosilanes are epoxysilanes such as 3-glycidyloxypropyltrimethoxysilane (GPTS), methacryloyloxypropyltrimethoxysilane (MPTS) and acryloyloxypropyltrimethoxysilane.

After application, the layer is dried and crosslinked in accordance with the functional group thereof. This may entail the addition of crosslinking initiators.

After the process, further layers may also be applied, for example in order to protect the coated surface of the substrate against UV radiation.

A particular advantage of the process according to the invention is that the compositions used are applied to the substrates in a simple manner. The initiator layer with the photocatalytically active substance enables the production of particularly fine structures in only a few steps. For this purpose, all known printing processes are used, such as inkjet printing, intaglio printing, screen printing, offset printing or relief printing and flexographic printing. Often, for the printing of the electrical functionalities, combination prints of the aforementioned printing processes are also used. It may be necessary to match the printing plates or rollers or stamps used to the properties of the compositions, for example by matching the surface energy thereof.

There is actually no restriction in the structures applied by structuring. For instance, it is possible to apply connected structures such as conductor tracks. In addition, it is also possible to apply point structures. Owing to the good resolution, it is possible by the process to apply conductive dots invisible to the eye to a film. This is very important in the production of surfaces for touchscreens.

The structuring by the application of the structure template can even be integrated into customary printing processes, the structure template replacing the print original.

The invention also relates to a coated substrate obtained by the process according to the invention. Such a substrate features an initiator layer comprising photocatalytically active nanorods.

This layer has a thickness between 50 nm and 200 µm. Preferred layer thicknesses are between 100 nm and 1 µm, preferably 50 nm to 700 nm. The layer thickness may also be between 20 and 70 µm. The layer may also comprise a matrix material, as already described for the process. Preference is given to an organically modified inorganic matrix material.

On this layer is applied, at least in a region of the surface of the initiator layer, a metal layer. This layer is only up to 200 nm. Preferred layer thicknesses are between 20 and 100 nm, preferably 50 to 100 nm. As metals come into consideration especially copper, silver, gold, nickel, zinc, aluminum, titanium, chromium, manganese, tungsten, platinum or palladium, preferably silver or gold.

In a development of the invention, the metal layer has, atop the initiator layer, structuring with structural elements having a dimension of less than 50 µm, preferably less than 10 µm.

In a particularly advantageous development of the invention, the coated substrate has metallic structures which are at least partly transparent. This can be achieved, for example, by the application of structures having a resolution of less than 20 µm to a transparent substrate, preferably less than 10 µm. They may also be structures having a resolution of less than 5 µm or even 1 µm. "Resolution" means that the structure has structures having a minimum dimension of less than the resolution mentioned. These may be metalized or nonmetallized regions.

The coated substrates which are obtained by the process according to the invention can be used for many applications. Firstly, the process is suitable for application of reflective metal layers to surfaces. These can be used, for example, as reflective layers in holographic applications.

A particular advantage of the invention lies in the production of conductive structures. These are suitable as conductor tracks in electronic applications, in touchscreen displays, solar collectors, displays, as RFID antennas or in transistors. They are therefore suitable as a substitute in products which have to date been produced on the basis of ITO (indium tin oxide), for example in TCO coatings (TCO: transparent conductive oxide).

However, the structures can also be used in the transistors sector.

Further details and features are evident from the description of preferred working examples which follows in conjunction with the dependent claims. It is possible here for the particular features to be implemented alone, or several in combination with one another. The means of solving the problem are not restricted to the working examples. For example, stated ranges always include all unspecified intermediate values and all conceivable component intervals.

DETAILED DESCRIPTION OF INVENTION

Figure 1:
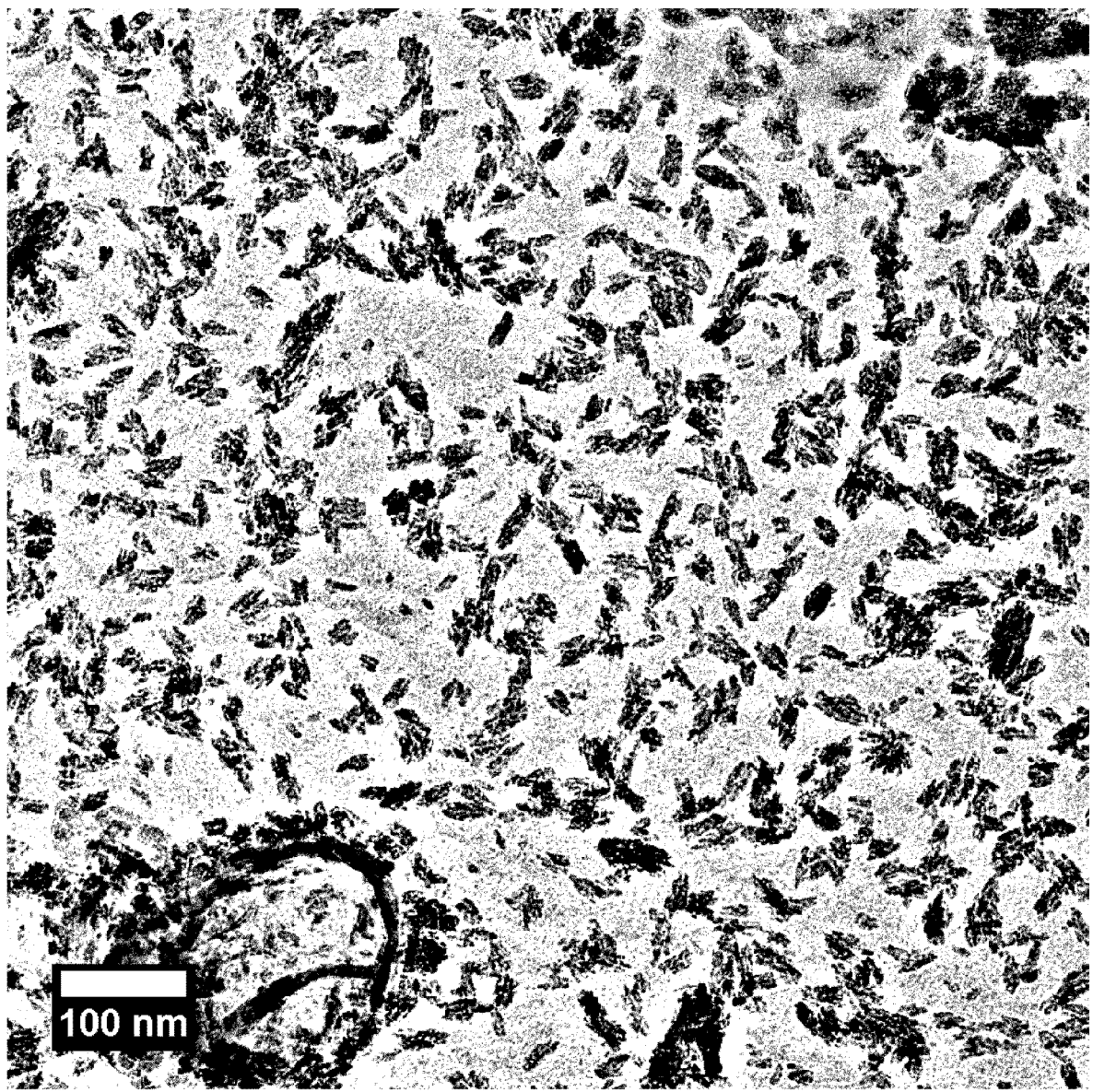
FIG. 1 TEM image of nanorods of $TiO_2$.

FIG. 1 shows a TEM image (transmission electron microscope) of inventive nanorods of $TiO_2$. The elongation thereof is clearly evident.

Figure 2:
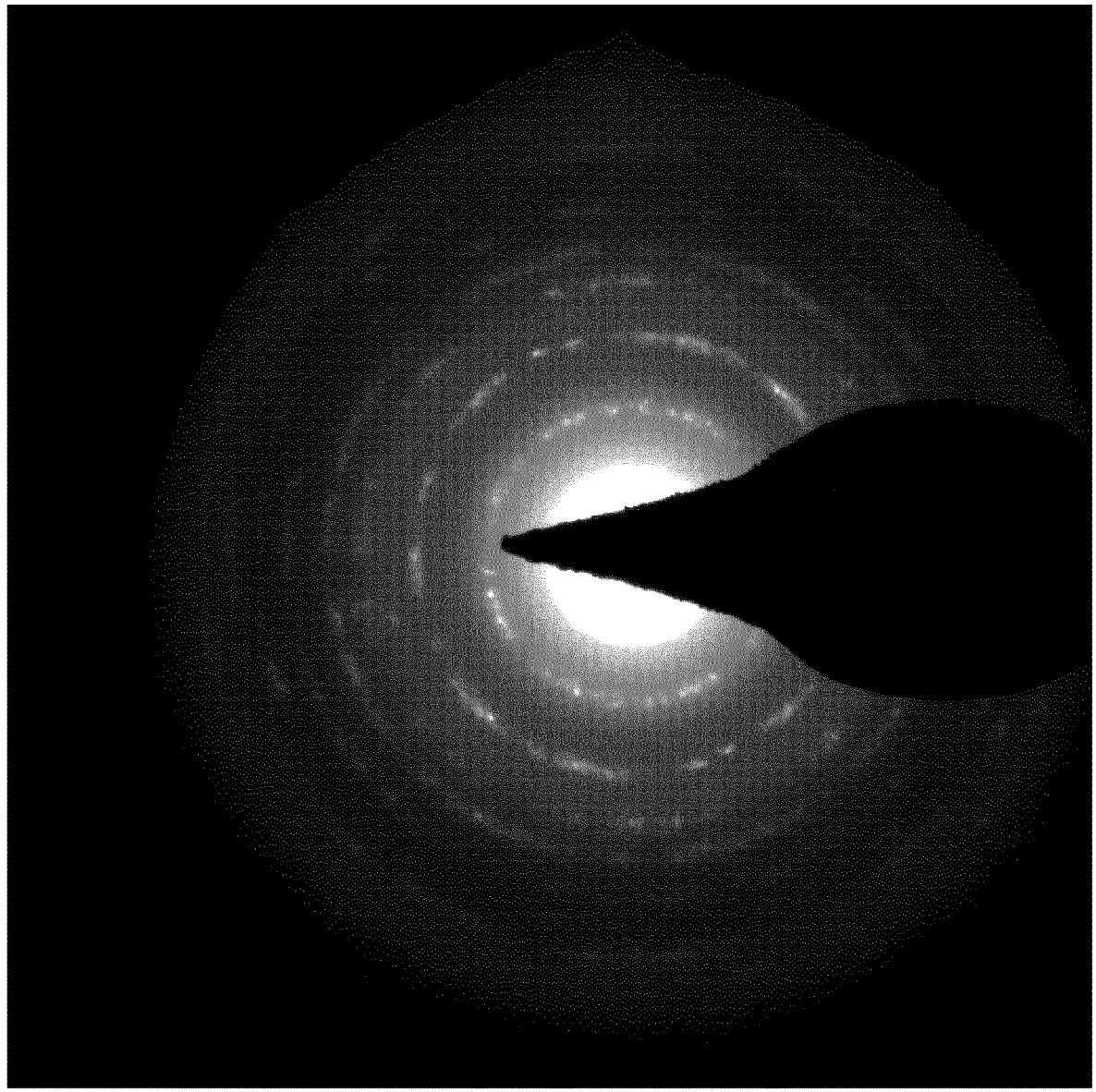
FIG. 2 electron diffractogram of the nanorods.

FIG. 2 shows a diffractogram of nanorods of $TiO_2$. The reflections demonstrate the crystalline structure of the nanorods.

Figure 3A:
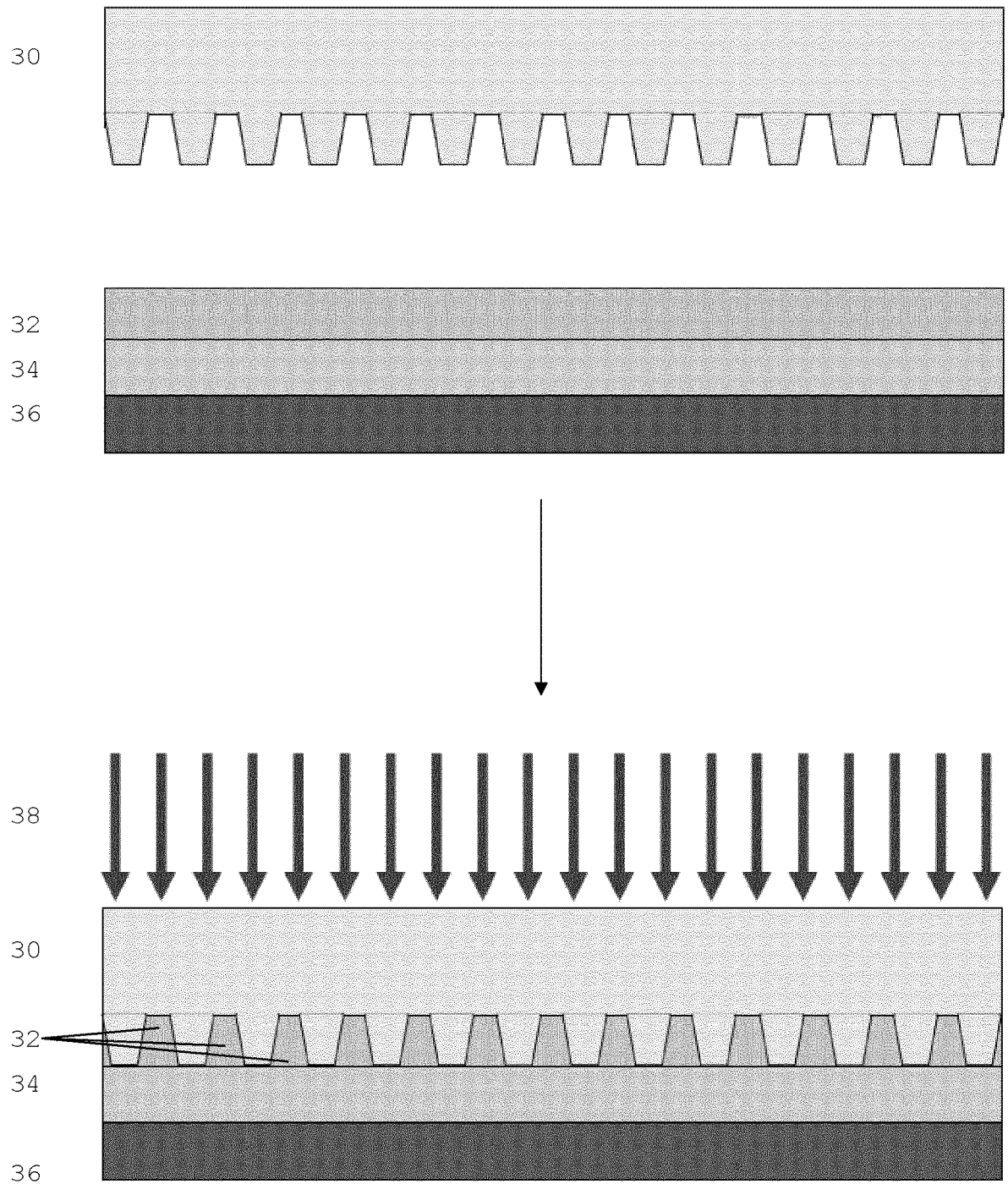
FIG. 3A schematic diagram of one embodiment of the process according to the invention (30: structure template; 32: precursor composition; 34: initiator layer; 36: substrate; 38 UV light)

FIG. 3A shows a schematic diagram of one embodiment of the process according to the invention. A substrate (36) is coated with a photocatalytically active initiator layer (34). To this layer is applied a layer of the precursor composition (32). To a substrate coated in this way is applied a structure template (30), the structure template (30) being brought into at least partial contact with the initiator layer (34). This results in displacement of the precursor composition at these sites. The precursor compound (32) is displaced into the depressions of the structure template (30) which are not in contact with the initiator layer (34). Then exposure is effected with UV light (38) through the structure template. This reduces the precursor compound and deposits a metal layer at the sites where the precursor composition has not been displaced.

Figure 3B:
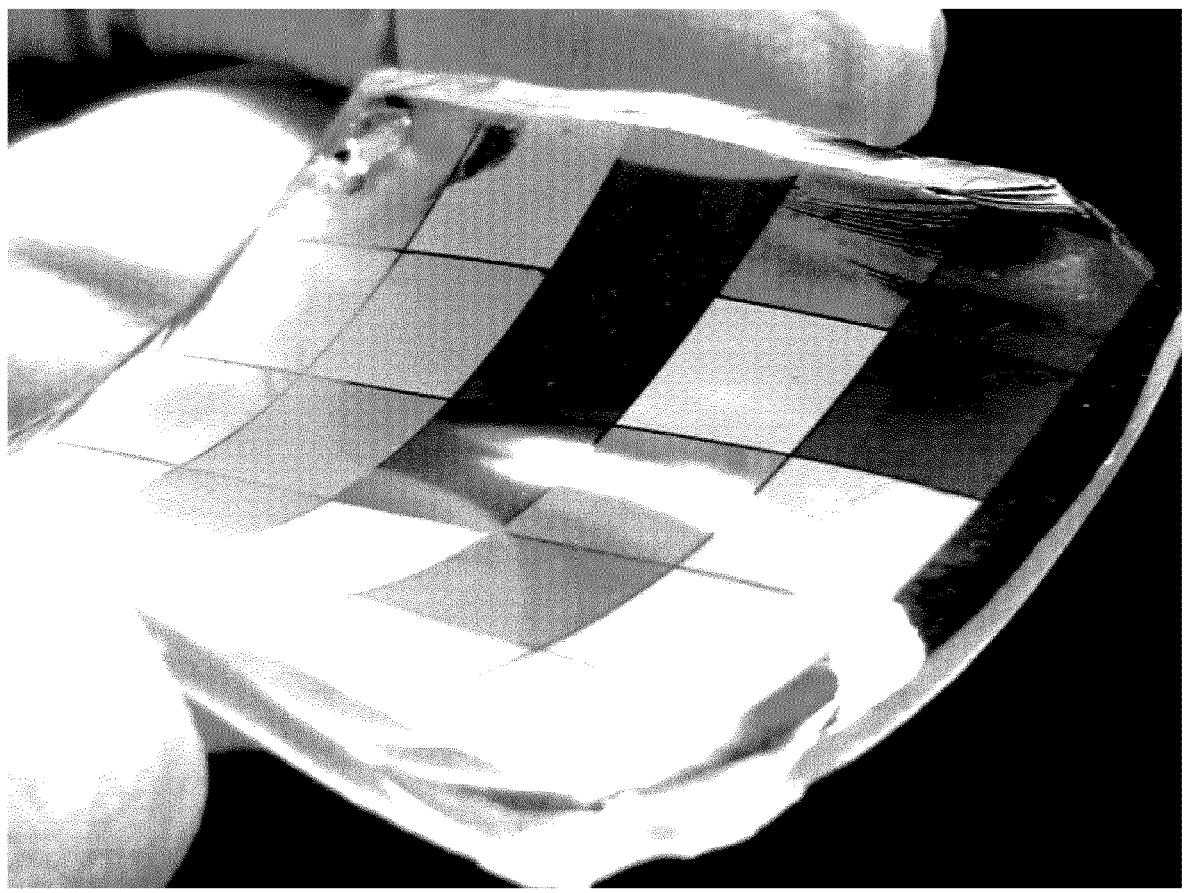
FIG. 3B image of the PDMS stamp template used, produced by means of an impression operation from a commercially available nickel master.

FIG. 3B shows a PDMS stamp template used in the examples, produced via an impression operation from a nickel master. The production of such stamps forms part of the specialist knowledge of the person skilled in the art.

Figure 3C:
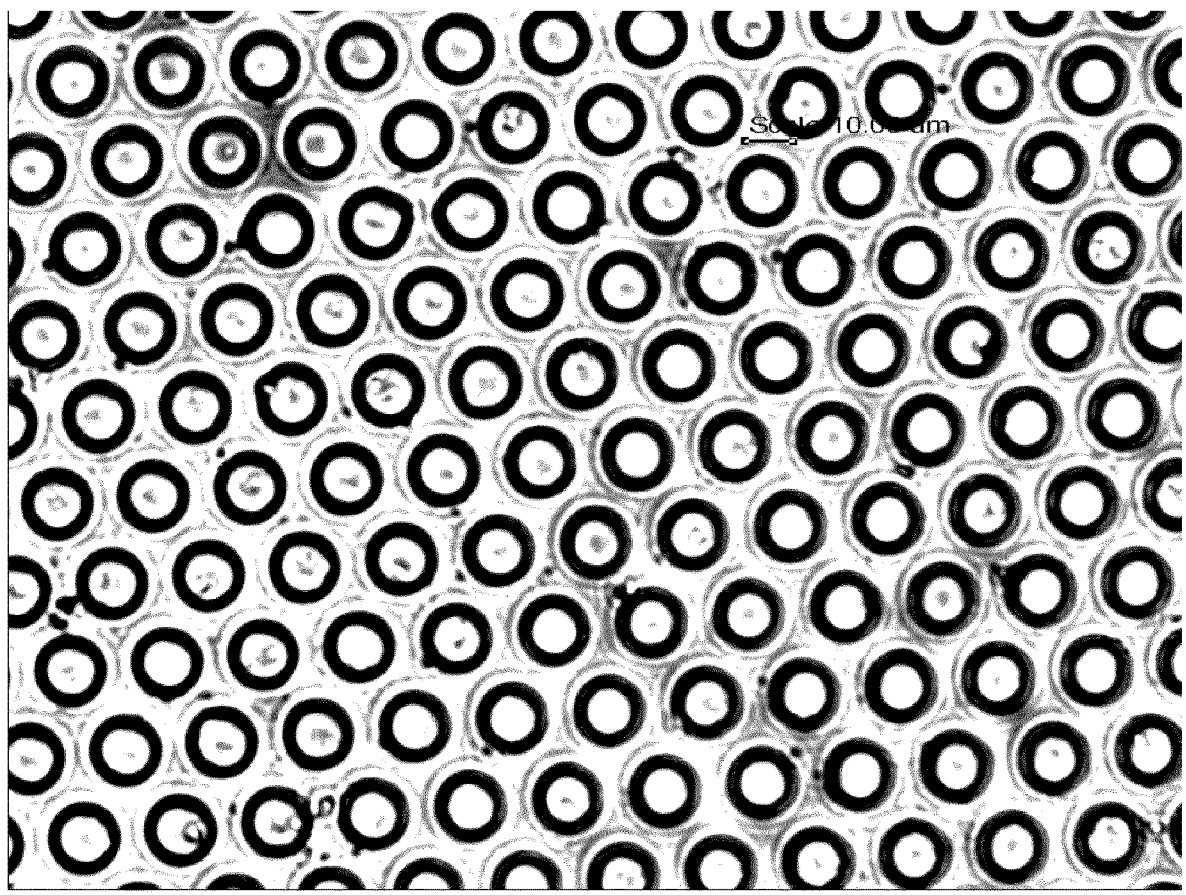
FIG. 3C light micrograph of a surface structure of the PDMS stamp shown in FIG. 3B.

FIG. 3C shows a light micrograph of a surface structure of the stamp shown in FIG. 3B. The stamp has cylindrical elevations in a regular hexagonal pattern. The metallic structures produced with this structure template thus show a regular arrangement of circular uncoated regions.

Figure 4:
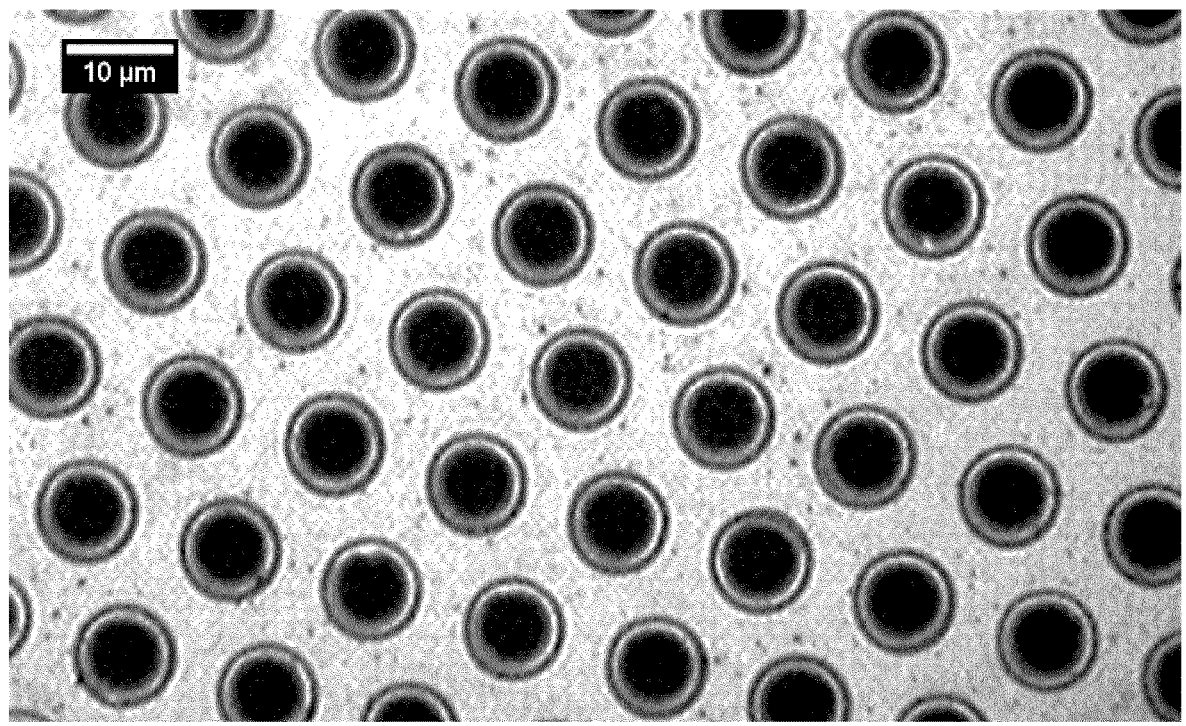
FIG. 4 light micrograph of a metallic structure produced (reflected light image). The light-colored regions are the silver depositions.

FIG. 4 shows a light micrograph of a metallic structure produced by the process according to the invention. The sharp delimited regions of the deposition of the metallic structures are clearly evident. The sharpness of the metallic structure also shows that much finer structures are possible by the process than the structures shown having structuring of less than 10 μm.

Figure 5:
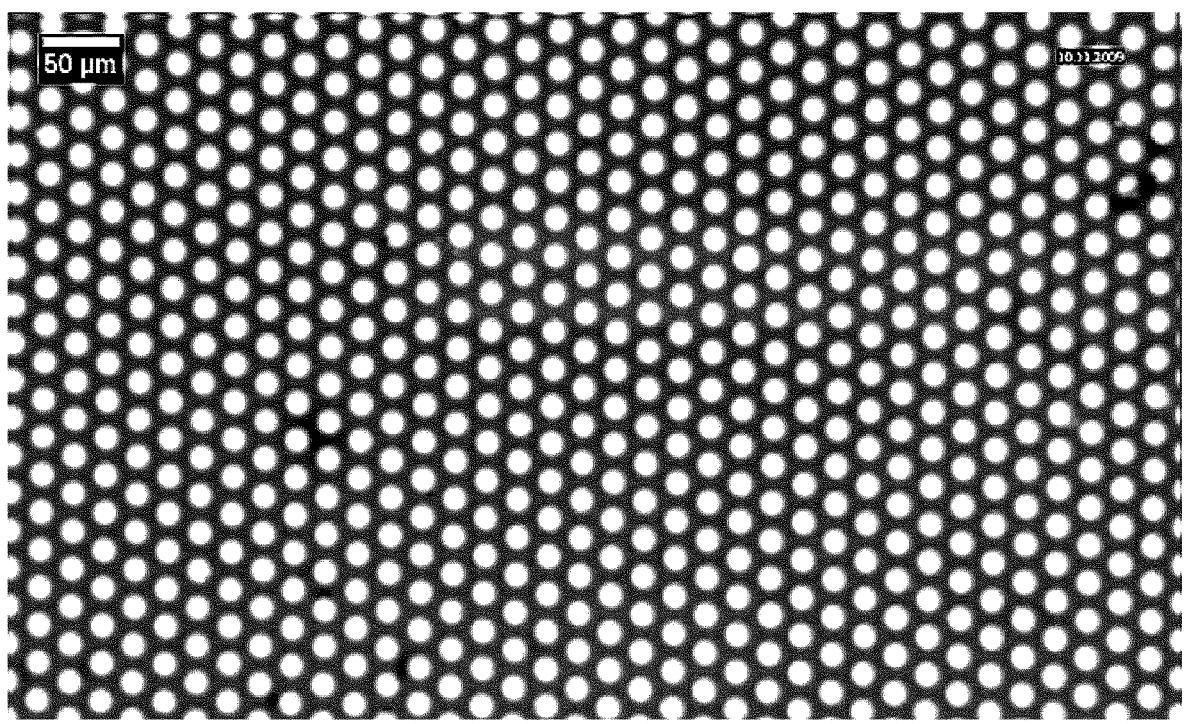
FIG. 5 light micrograph of a metallic structure produced (transmitted light image). The dark-colored regions are the silver depositions.

FIG. 5 shows a light micrograph of a metallic structure produced by the process according to the invention. In contrast to FIG. 4, a structure template having circular pimples, which appear as nonmetallized circles on the image, was used. Even with structure templates of this kind, a high resolution can be achieved.

Figure 6:
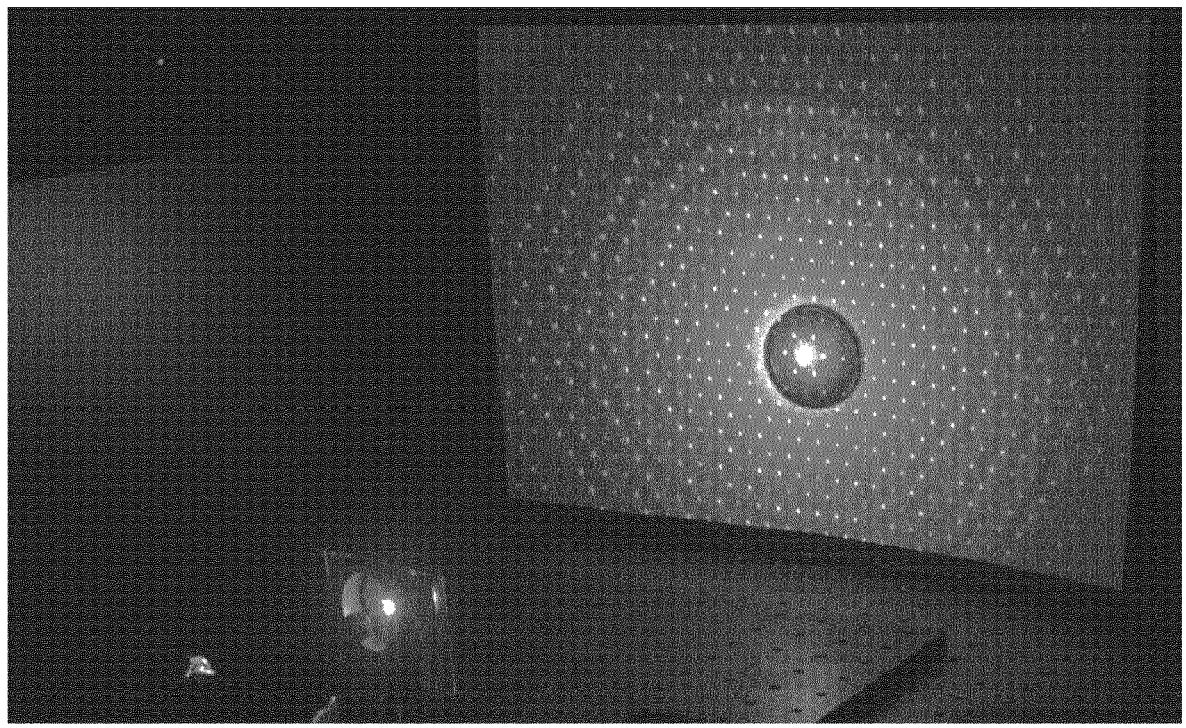
FIG. 6 photograph of an experimental setup for demonstration of an interference pattern involving passing laser radiation through a metallic structure produced.

FIG. 6 shows an experimental setup in which the interference of a transparent inventive metallic structure is shown. This involves exposure with a laser through a substrate structured in accordance with the invention. The homogeneous structure on the surface results in interference phenomena which are visible on the surface set up at a particular distance. The concentric rings are clearly evident. This involved attenuating the laser light spot on the surface by means of a filter placed there, in order to make the rings visible for the photograph. This experimental setup firstly shows the transparency of the coatings obtained, and also the high imaging accuracy in the case of use of regular structure templates. Only in the case of very high imaging accuracy is there interference.

Figure 7:
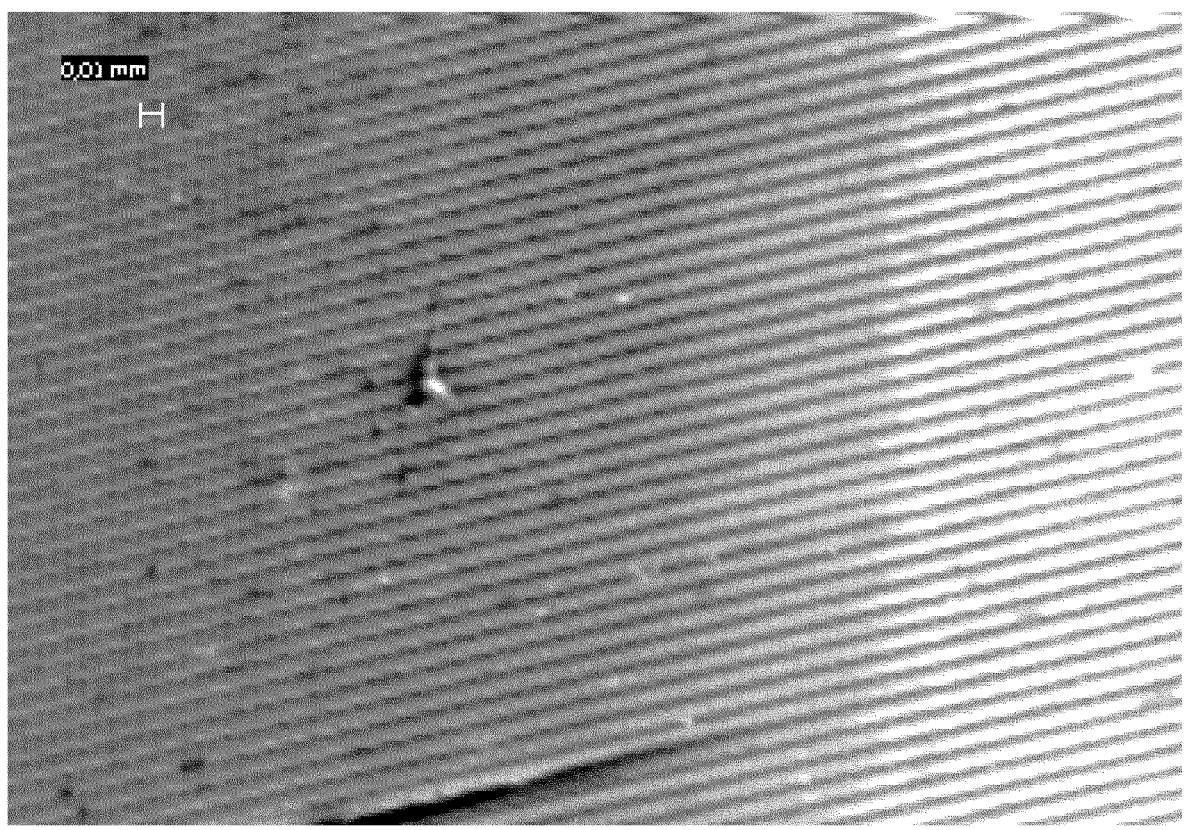
FIG. 7 light micrograph (transmitted light image) of linear metallic deposition produced using $TiO_2$ nanorods. The dark-colored areas show silver depositions. The scale corresponds to 10 μm.

FIG. 7 shows a light micrograph of a linear metallic structure which has been produced using a corresponding stamp.

Figure 8:
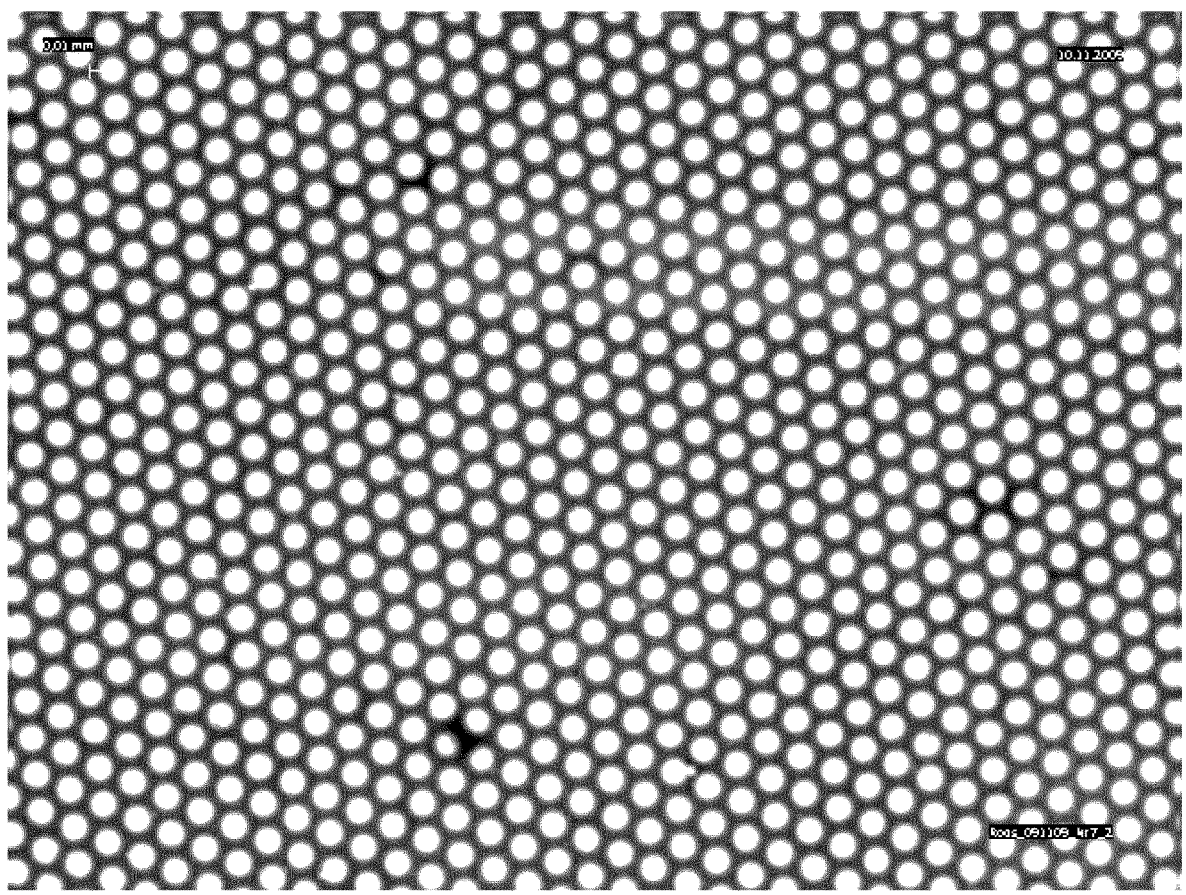
FIG. 8 light micrograph (transmitted light image) of structured metallic depositions produced using $TiO_2$ nanorods. Dark-colored areas show silver depositions. The scale corresponds to 10 μm.

FIG. 8 shows a metallic structure with a circular pattern analogous to FIG. 5.

Numerous modifications and developments of the working examples described can be implemented.

EXAMPLES (1) Substrates Used

The substrates used were various films and glasses. For instance, the films used were polyethylene terephthalate films or polyimide films, polycarbonate substrates and PMMA substrates, and the glasses used were soda-lime glass or borosilicate glass. The size of the substrates varied between 5 cm×5 cm and 10 cm×10 cm. The thickness of the substrates varied between 0.075 mm and 5 mm.

(2) Production of the Nanorods

Method taken from: Jia, Huimin et al., *Materials Research Bulletin,* 2009, 44, 1312-1316, "Nonaqueous sol-gel synthesis and growth mechanism of single crystalline $TiO_2$ nanorods with high photocatalytic activity".

240 ml of benzyl alcohol were initially charged in a 500 ml Schott bottle with a stirrer flea. Subsequently, everything (benzyl alcohol, syringe, titanium tetrachloride) was introduced into a glovebag under argon, the benzyl alcohol bottle was opened and the bag was flushed twice with argon (=filled with Ar and partly emptied and filled again) while stirring vigorously. By means of a 20 ml syringe and a long cannula, 12 ml of $TiCl_4$ were withdrawn, the cannula was removed from the syringe and the $TiCl_4$ was added dropwise to the benzyl alcohol while stirring vigorously.

Every drop of $TiCl_4$ added caused a noise like a crack or bang, and significant evolution of smoke was observed. At the same time, the solution turned an intense red and heated up. On completion of addition, the solution was an intense orange-yellow color and red agglomerates had formed. The mixture was left to stir with the lid open under an Ar atmosphere for another ~1 h and then taken out of the glovebag. The solution was then intense yellow in color with several small and somewhat thicker white/yellow agglomerates.

Under a fume hood, the mixture was then left open to stir for another ~1 h, before being divided into two Teflon vessels without the thicker lumps (~130 g each) and autoclaved (pressure digestion: in block A; time: 2×23 h 59 min; temp.: 80° C.)

The supernatant in both Teflon vessels was removed by means of a pipette, and the gel-like white precipitate was slurried, introduced into centrifuge tubes and centrifuged (15 min; at 2000 RCF; at RT; braking power: 0). The centrifugate was decanted and chloroform was added to the residue. The mixtures were left to stand overnight.

The centrifuge tubes were balanced out in pairs with chloroform, shaken properly until no larger agglomerates were observable any longer, and centrifuged (15 min; 3000 RCF; RT; braking power: 0). The centrifugate was decanted again and chloroform was again added to the residue. Subsequently, the further procedure was as described above (without leaving to stand overnight). Overall, the particles were washed three times with chloroform.

After the last decanting operation, the centrifuge tubes were left open to stand under a fume hood overnight and, the next morning, the dried nanorods were transferred into a snap-lid bottle.

(3) Preparation of the Silver Complex Solution 0.1284 g (1.06 mmol) of TRIS (tris(hydroxymethyl)aminomethane) was dissolved in 0.5 g (27.75 mmol) of deionized $H_2O$ and 0.5 g (10.85 mmol) of EtOH. In addition, 0.0845 g (0.5 mmol) of $AgNO_3$ was dissolved in 0.5 g (27.75 mmol) of deionized $H_2O$ and 0.5 g 10.85 mmol) of EtOH. The $AgNO_3$ solution was added to the first solution while stirring. The solution of the metal complex formed was colorless and clear. The solution can also be prepared in pure deionized water.

(4) Lyothermal Synthesis of $TiO_2$ Particles (lyo-$TiO_2$)

48.53 g of Ti $(O-i-Pr)_4$ were added to 52.73 g of 1-PrOH (n-propanol). To this solution was slowly added dropwise a solution of hydrochloric acid (37%, 3.34 g) and 10.00 g of 1-PrOH. To this solution was then added dropwise a mixture of 4.02 g of $H_2O$ and 20.00 g of 1-PrOH. The solution obtained may be pale yellow in color and was transferred to a pressure digestion vessel (approx. 130 g). In this vessel, the solution was treated at 210° C. for 2.5 h.

The mixture was decanted and the particles obtained were transferred to a flask and the solvent was removed at 40° C. in a rotary evaporator under reduced pressure.

For further use, the particles obtained were suspended in water.

(5) General Use

The steps which follow were conducted for each sample. The substrates were pre-cleaned with ethanol, propanol and lint-free tissues. The various suspensions were applied either by flow coating or by knife coating. The $TiO_2$ layers obtained were dried in an oven at temperatures between 100° C. and 150° C., especially at 120° C. or 140° C., for 5 to 30 minutes. Thereafter, the substrates were rinsed with deionized water to remove residues, and dried with compressed air.

Thereafter, the solution of the silver complex was applied. The structure template, usually a PDMS stamp, was applied to the surface and irradiated with UV radiation. Thereafter, the excess silver complex was removed by rinsing with deionized water and the coated substrates were dried with compressed air. The light source used was a mercury-xenon lamp (LOT-Oriel solar simulator, 1000 W, focused onto an area of 10 cm×10 cm). The intensity of the lamp was measured with the "UV-Integrator" digital measuring instrument (BELTRON) and was 55 $mmW/cm^2$ within the spectral range from 250 to 410 nm.

(6) Suspensions of $TiO_2$ nanorods in $H_2O$/EtOH

First of all, the $TiO_2$ nanorods were suspended in deionized water. Thereafter, an appropriate amount of ethanol was added. In all suspensions, the ratio of $H_2O$ and EtOH in the suspensions was $H_2$:EtOH→20:80 in % by weight or 10:90 in % by weight. For the production of $TiO_2$ layers, the following suspensions were prepared:

1.5% by weight of $TiO_2$ nanorods in $H_2O$/EtOH (7) Application of the $TiO_2$ Layer to a Porous $SiO_2$ Layer The suspension of $TiO_2$ nanorods was applied by flow coating to a porous $SiO_2$ layer on glass. For this purpose, a standard $SiO_2$ sol was used.

(8) Production of a Structure Template

Production of an embossing stamp as a cast of a nickel master There follows a description of the production of an embossing stamp made from PDMS (silicone rubber) as a cast of a nickel master.

1. Description of the Nickel Master and of the Casting Mold

The nickel master is a nickel foil produced by electroplating and of dimensions 100 mm×100 mm, to which a microstructure (cylindrical depressions in regular arrangement having a diameter of 5 μm, a height of 10 μm and a separation of 5 μm) has been applied. This nickel foil is bonded to the base of a casting mold produced from aluminum or a similar material, or mounted by means of ferromagnetic adhesive film. It should be noted here that the nickel master should be applied with absolute planarity, since any unevenness will be reflected in the later stamp.

In addition, the casting mold has to be placed in a very substantially horizontal position in order that the embossing stamp later has a homogeneous thickness.

2. Mixing of the Silicone Rubber and Mold Casting

The two components of the PDMS (e.g. Sylgard 184 from Dow Corning) are combined in the appropriate ratio (e.g. 10:1) and the two components are mixed by stirring. The amount to be made up is guided by the desired thickness of the embossing stamp (typical stamp thickness: 2 to 4 mm). The mixing vessel should have 3 times the volume of the mixture in order to prevent overflow in the subsequent degassing operation.

To remove the air bubbles mixed in during stirring, the mixture is introduced into a vacuum drying cabinet (at room temperature) and evacuated until all air bubbles have been removed.

The degassed PDMS mixture is then introduced into the casting mold and the mixture is allowed to cure. In most cases, it is advisable to accelerate the curing by temperature control of the casting mold. Typically, heating of the casting mold to 70° C. over one hour leads to full curing of the PDMS.

3. Demolding Operation

The demolding of the PDMS stamp is accomplished by using a scalpel or another sharp blade to cut the PDMS away from the vertical wall of the casting mold over the entire circumference and then lifting it away from the edge with a flat and blunt tool (for example a flat spatula) and then cautiously detaching it from the nickel master.

Irregular sites at the edge can then be cut away with a sharp blade (for example carpet knife).

The reason for the use of PDMS as the stamp material is the transparency of this material for UV light, which is used for the photochemically implemented metallization. In this context, a suitable stamp material is also any other material which meets the demands of UV transparency and demoldability according to point 3. of the abovementioned example of the production of the embossing stamp as a cast of a nickel master.

(9) Production of the Silver Microstructures

The substrates (e.g. glass, PMMA, PET, PVC, PS, . . . ) were coated with $TiO_2$ nanorods. A transparent coating was obtained.

Thereafter, the coated surface was wetted with the solution with the silver complex. A PDMS stamp (polymethyldisiloxane) was pressed onto the substrate. In the course of this, the elevations of the stamp and the points which come into contact with the photocatalytic layer displace the solution with the silver complex at these points. The substrate was then irradiated through the transparent stamp with UV light (e.g. LOT-Oriel solar simulator, 1000 W Hg(Xe) light source, focused onto an area of 10×10 $cm^2$) for 20 s to 2 minutes. The stamp was removed and the excess silver complex was removed by washing. Thereafter, the substrates were dried. It is also possible to effect thermal aftertreatment, for example at temperatures between 50° C. and 200° C. Optionally, a further protective layer was applied or laminated on. This operation gives structures having a resolution of up to 1 µm.

For the metallic structures shown in the figures, a $TiO_2$ layer of nanorods was applied as a suspension without a binder system in a thickness of approx. 60 nm, and a solution of the silver complex was applied. Application of a PDMS stamp of appropriate shape was followed by exposure for 20 s to 60 s. The stamp had a structure depth of <10 µm, which then corresponds roughly to the thickness of the layer of the solution of the silver complex during the exposure.

The process enables production of metallic structures in a simple manner with only two coating compositions.

(10) Production of Metallic Structures with PDMS Stamps

1.

An initiator-coated substrate according to (5) is placed under the exposure unit and wetted (overcoated) with the suspension of the precursor composition as described in Example (5).

2.

A PDMS embossing stamp produced as described in (8) is then moved toward the wetted substrate at an angle of 45° on one side and placed on gradually until it lies completely planar on the substrate. This serves to prevent possible inclusions of air which could have an adverse effect on the quality of the structured metallization.

3.

The embossing stamp is then weighted down over the full area in such a way that the beam path for a later exposure of the initiator layer remains unimpeded. This is achieved by placing a UV-transparent quartz glass sheet, the dimensions of which are greater than the embossing stamp, onto the latter over the full area. Onto this is placed a frame made of any material which leaves the beam path through the PDMS stamp unimpeded and serves merely to weigh down the quartz glass sheet and hence also the stamp. The aim of this process is to completely displace the suspension of the precursor composition under the raised regions of the structured stamp between the latter and the substrate coated with initiator layer. The minimum pressure needed for that purpose depends on the structure type and size of the stamp and is determined empirically for every stamp used. The maximum pressure which may be exerted without adversely affecting the quality of the metallization result is at first likewise determined empirically. This depends not only on the structure type and size but also on the aspect ratio of the structures as a result of the deformability of the stamp material. An adverse effect of the metallization result in the context of the application is reduced resolution or altered shape of the metallic structures resulting from plastic deformation of the stamp or else a lower resulting thickness of the metallic layer resulting from displacement of the suspension of the precursor composition from the non-raised regions (equivalent to interstices) of the embossing stamp.

4.

The initiator layer is then irradiated through the UV-transparent quartz glass layer, the UV-transparent embossing stamp and the UV-transparent suspension of the precursor composition, as described in (5).

5.

After sufficient irradiation time, the beam path at the light source is blocked by means of a shutter and, simultaneously or successively, the weighting frame, the quartz glass sheet and the embossing stamp are removed from the substrate and the latter is rinsed as described in (9) and dried and optionally thermally aftertreated as described in (9).

6.

Alternatively to point 1. of this example, the stamp can also first be applied as described in point 2. of this example to the substrate, except that it is unwetted, and weighted as described in point 3. Subsequently, the suspension of the precursor composition is applied to the substrate at any number of sites on the edge of the stamp until the interstices between stamp and substrate have been completely filled with the same suspension owing to the capillary forces and the air has been removed therefrom. For this purpose, it may be necessary or advantageous to tilt the substrate along with the stamp, quartz glass and frame.

Subsequently, the further procedure is according to points 4. and 5. of this example.

REFERENCE NUMERALS

30 Structure template
32 Precursor composition
34 Initiator layer
36 Substrate
38 UV light

LITERATURE CITED

U.S. Pat. No. 5,534,312
US 2004/0026258 A1
US 2005/0023957 A1
US 2006/0144713 A1
Noh, C.-, et al., Advances in Resist Technology and Processing XXII, Proceedings of SPIE, 2005, 5753, 879-886, "A novel patterning method of low-resistivity metals".
Noh, C.-, et al., Chemistry Letters, 2005, 34(1), 82-83, "A novel patterning method of low-resistivity metals".
US 2009/0269510 A1
Jia, Huimin et al., Materials Research Bulletin, 2009, 44, 1312-1316, "Nonaqueous sol-gel synthesis and growth mechanism of single crystalline $TiO_2$ nanorods with high photocatalytic activity".

The invention claimed is:

1. A process for producing metallic structures, comprising the following steps:
   (a) applying an initiator composition to a substrate, the composition comprising a photocatalytically active inorganic substance comprising nanorods having a ratio of length to diameter of between 1000:1 to 2:1 as an initiator, to form an initiator layer;
   (b) applying a precursor composition comprising a precursor compound for a metal layer to the substrate;
   (c) applying a structure template to the initiator layer with partial displacement of the precursor composition; and (d) reducing the precursor compound to the metal by electromagnetic radiation through the structure template on the initiator, thereby forming a single metal layer comprising the metallic structures on the substrate.

2. The process as claimed in claim 1, wherein the photocatalytically active inorganic substance comprises $TiO_2$ or ZnO.

3. The process as claimed in claim 2, wherein the photocatalytically active substance comprises $TiO_2$.

4. The process as claimed in claim 1, wherein the precursor compound comprises a silver, gold or copper complex.

5. The process as claimed in claim 1, wherein the application of the initiator composition is preceded by pretreatment of the surface of the substrate, said pretreatment comprising a plasma treatment, corona treatment, flame treatment and/or the application and curing of an organic-inorganic coating.

6. The process as claimed in claim 1, wherein the precursor composition is applied in step (b) to the structure template which is applied to the initiator layer in step (c) together with the structure template.

7. The process as claimed in claim 1, wherein the nanorods have a length between 30 and 100 nm, with a ratio of length to diameter between 10:1 and 3:1.

8. The process as claimed in claim 1, wherein the metallic structures have an at least partly transparent appearance.

9. The process as claimed in claim 3, wherein the $TiO_2$ is doped with a metal compound.

10. A process for producing metallic structures, comprising:

applying an initiator composition comprising $TiO_2$ nanorods to a substrate to form an initiator layer, said substrate comprising a polyethylene terephthalate film, polyimide film, or glass;

applying a precursor composition comprising a metal complex solution to the initiator layer;

applying a stamp comprising polydimethylsiloxane to a surface of the initiator layer, thereby displacing the precursor composition into depressions of the stamp; and reducing the precursor compound by electromagnetic radiation through the stamp on the initiator composition, thereby forming a single layer of metallic structures on the substrate.

11. The process as claimed in claim 1, wherein the nanorods have a diameter of less than 100 nm and a length of less than 500 nm.

12. The process as claimed in claim 1, wherein the nanorods have a diameter of 30-100 nm and a length of 200-500 nm.

13. The process as claimed in claim 10, wherein the metallic structures have a width of 10 to 100 µm.

14. The process as claimed in claim 10, further comprising placing a UV-transparent quartz glass sheet onto the PDMS stamp and said electromagnetic radiation is through the UV-transparent quartz glass sheet and the PDMS stamp.

* * * * *